(12) United States Patent
Chan et al.

(10) Patent No.: US 7,848,151 B2
(45) Date of Patent: Dec. 7, 2010

(54) CIRCUIT TO CONTROL VOLTAGE RAMP RATE

(75) Inventors: Johnny Chan, Fremont, CA (US); Philip S. Ng, Cupertino, CA (US); Alan L. Renninger, Kapolei, HI (US); Jinshu Son, Saratoga, CA (US); Jeffrey M. Tsai, San Jose, CA (US); Tin-Wai Wong, Fremont, CA (US); Tsung-Ching Wu, Saratoga, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/398,805

(22) Filed: Mar. 5, 2009

(65) Prior Publication Data

US 2009/0168586 A1    Jul. 2, 2009

Related U.S. Application Data

(62) Division of application No. 11/291,606, filed on Nov. 30, 2005, now Pat. No. 7,512,008.

(51) Int. Cl.
*G11C 11/34* (2006.01)
*G11C 16/04* (2006.01)
*G11C 16/06* (2006.01)
*G11C 7/10* (2006.01)
*G11C 5/14* (2006.01)

(52) U.S. Cl. .................. 365/185.23; 365/185.19; 365/189.06; 365/189.09

(58) Field of Classification Search ........... 365/189.06, 365/189.09, 185.23
See application file for complete search history.

(56) References Cited

U.S. PATENT DOCUMENTS

| 4,384,349 | A | * | 5/1983 | McElroy | ................ | 365/185.02 |
|---|---|---|---|---|---|---|
| 5,485,423 | A | | 1/1996 | Tang et al. | | |
| 5,754,470 | A | | 5/1998 | Engh et al. | | |
| 5,856,946 | A | * | 1/1999 | Chan et al. | ............. | 365/185.19 |
| 5,914,896 | A | | 6/1999 | Lee et al. | | |
| 6,055,186 | A | * | 4/2000 | Hung et al. | ............ | 365/185.18 |

(Continued)

FOREIGN PATENT DOCUMENTS

JP       2004047094 A    2/2004

OTHER PUBLICATIONS

"U.S. Appl. No. 11/291,606, Notice Of Allowance Mailed On Nov. 17, 2008", 9 Pgs.

(Continued)

*Primary Examiner*—Ly D Pham
(74) *Attorney, Agent, or Firm*—Schwegman, Lundberg & Woessner, P.A.

(57) ABSTRACT

A programming circuit and method to apply a controlled or predetermined voltage pulse for charge transfer to or from the floating gate of a non-volatile memory cell in an incremental manner to control the overall voltage across the gate oxide. Voltage above a transfer threshold voltage, such as above a tunneling threshold voltage, is applied in a stepwise charge transfer manner to or from the floating gate up to a voltage limit that is below the thin oxide damage threshold. Controlling the overall voltage avoids oxide breakdown and enhances reliability.

18 Claims, 13 Drawing Sheets

U.S. PATENT DOCUMENTS

| | | | |
|---|---|---|---|
| 6,392,931 B1 | 5/2002 | Pasotti et al. | |
| 6,519,182 B1 * | 2/2003 | Derhacobian et al. | 365/185.18 |
| 6,529,417 B2 | 3/2003 | Roohparvar | |
| 6,751,126 B2 * | 6/2004 | Kim | 365/185.18 |
| 6,961,267 B1 * | 11/2005 | Fastow et al. | 365/185.28 |
| 7,002,381 B1 | 2/2006 | Chung | |
| 7,512,008 B2 | 3/2009 | Chan et al. | |
| 2001/0043490 A1 * | 11/2001 | Mihnea et al. | 365/185.18 |
| 2003/0071666 A1 | 4/2003 | Bailey | |
| 2004/0037144 A1 | 2/2004 | Pascucci et al. | |
| 2004/0160349 A1 * | 8/2004 | Laflaquiere | 341/147 |
| 2006/0245262 A1 | 11/2006 | Li | |
| 2007/0121382 A1 | 5/2007 | Chan et al. | |
| 2007/0121384 A1 * | 5/2007 | Ng et al. | 365/185.23 |

OTHER PUBLICATIONS

"U.S. Appl. No. 11/291,606, Response filed Mar. 17, 2008 to Final Office Action mailed Jan. 16, 2008", 14 pages.

* cited by examiner

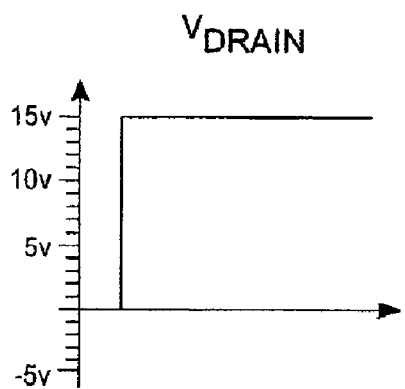
Fig._2A
(Prior Art)
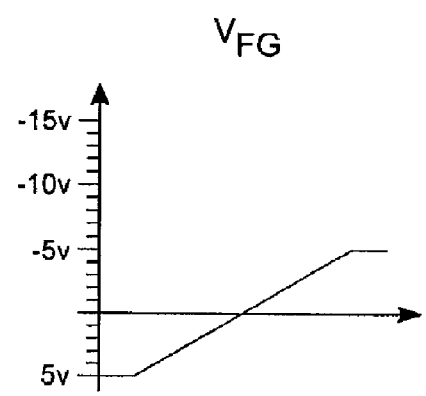
Fig._2B
(Prior Art)
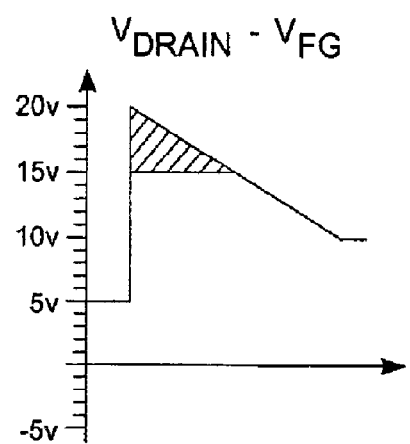
Fig._2C
(Prior Art)

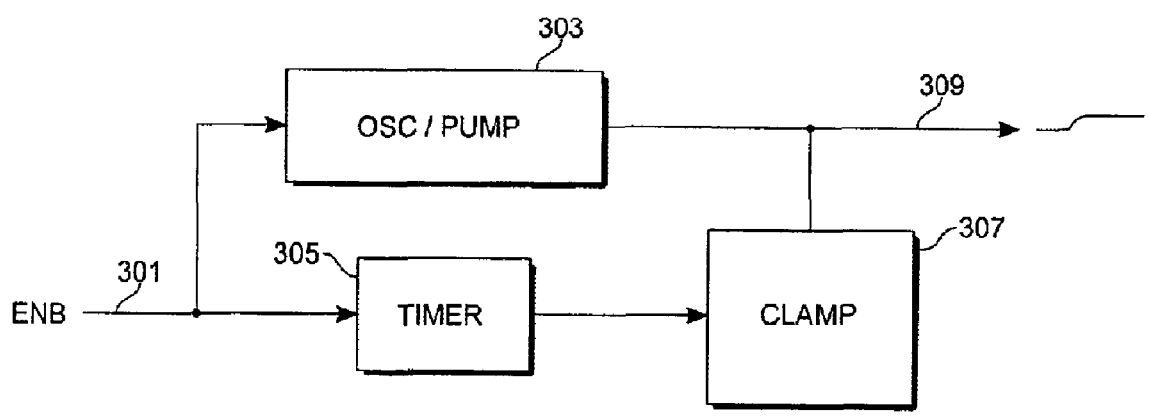
Fig._3

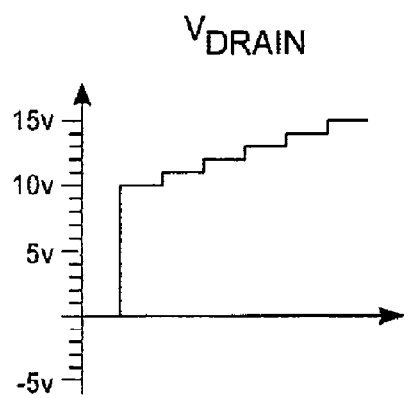
Fig. _4A
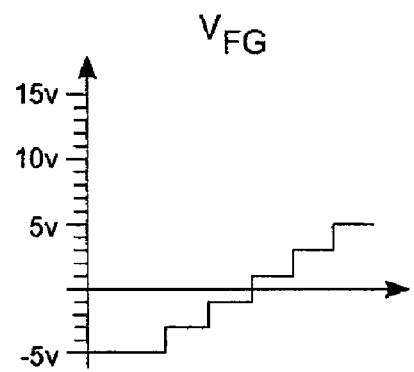
Fig. _4B
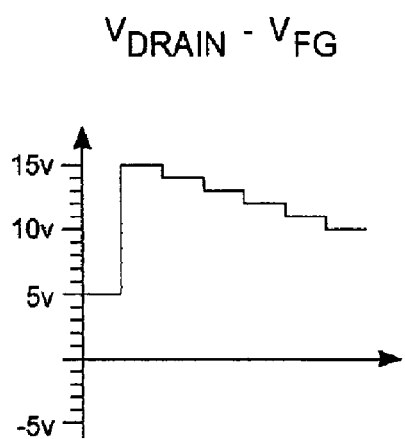
Fig. _4C

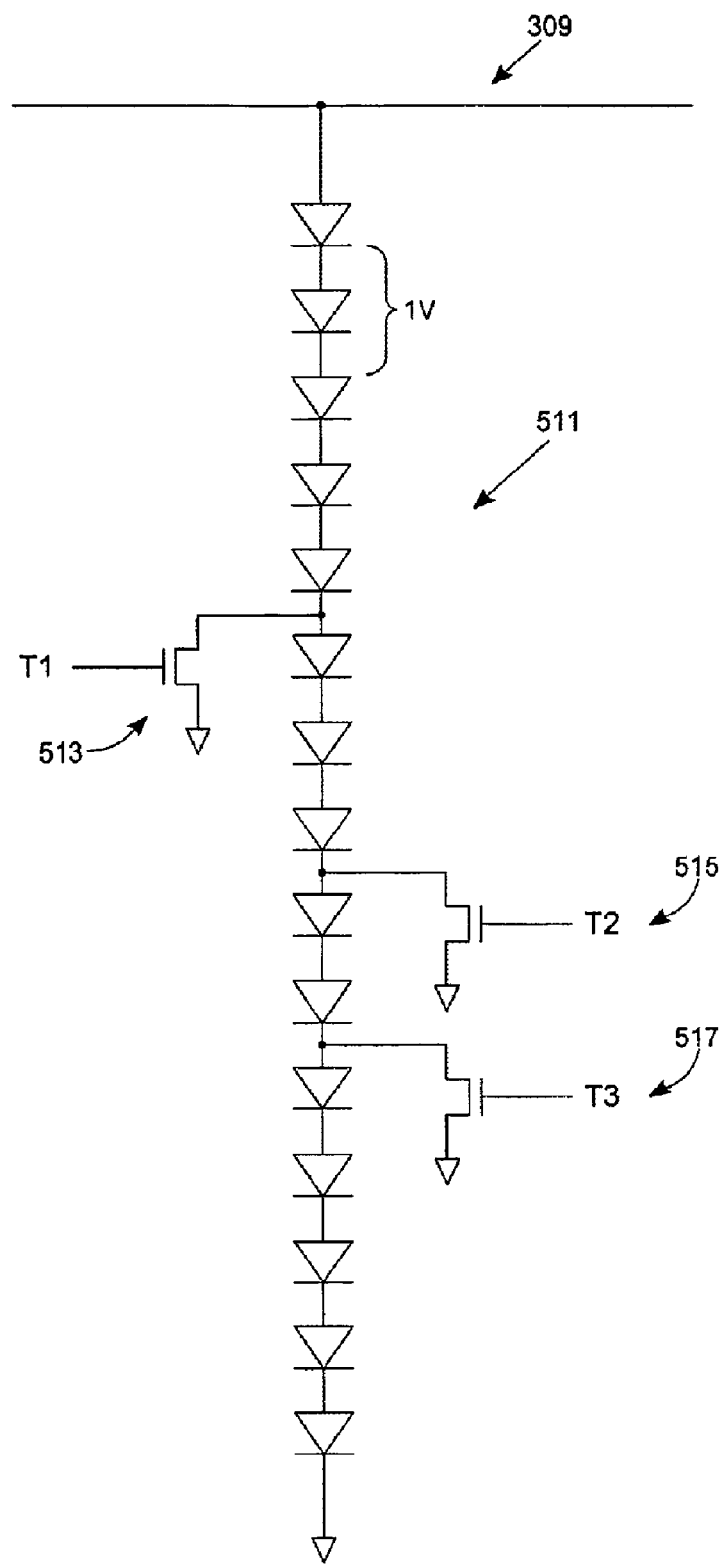
Fig._5

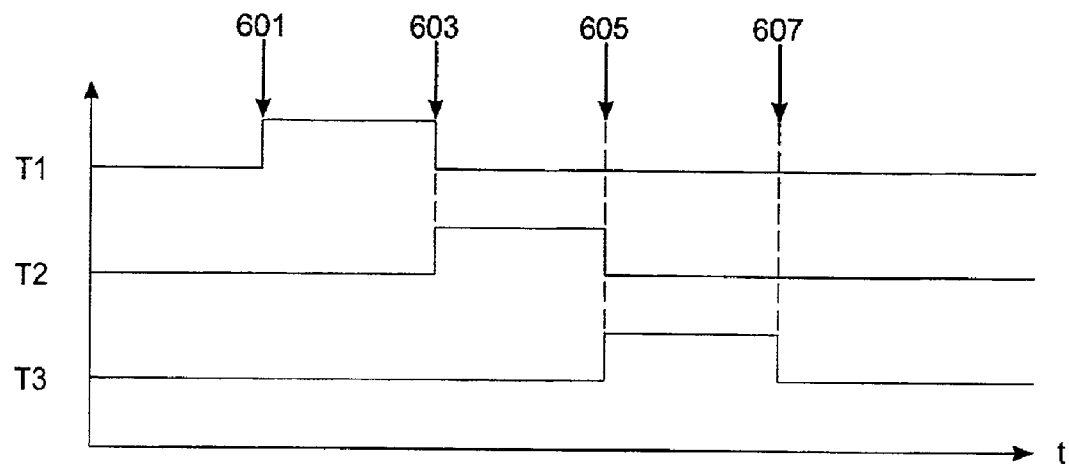
Fig._ 6A
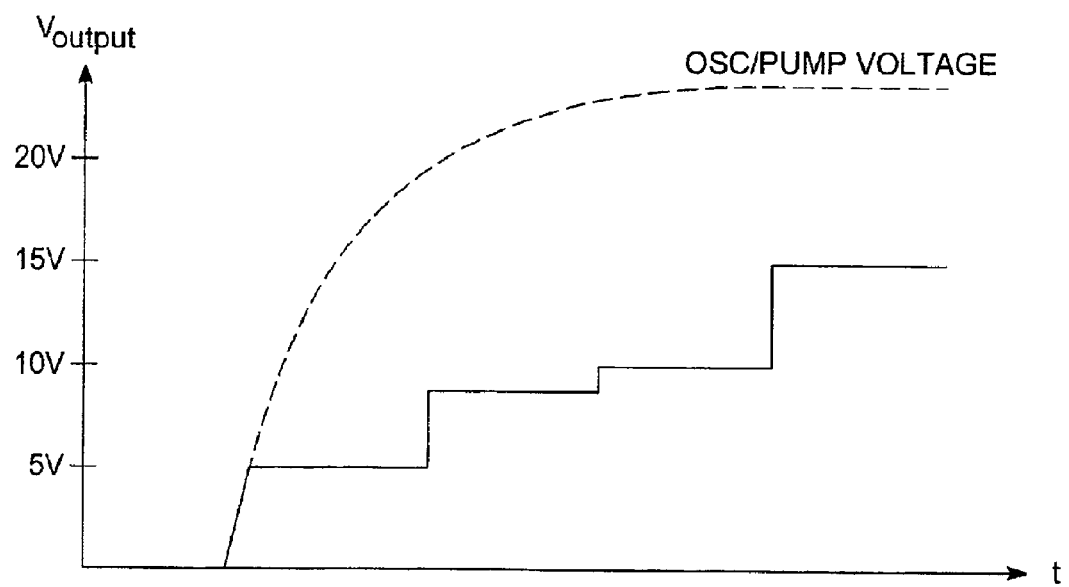
Fig._ 6B

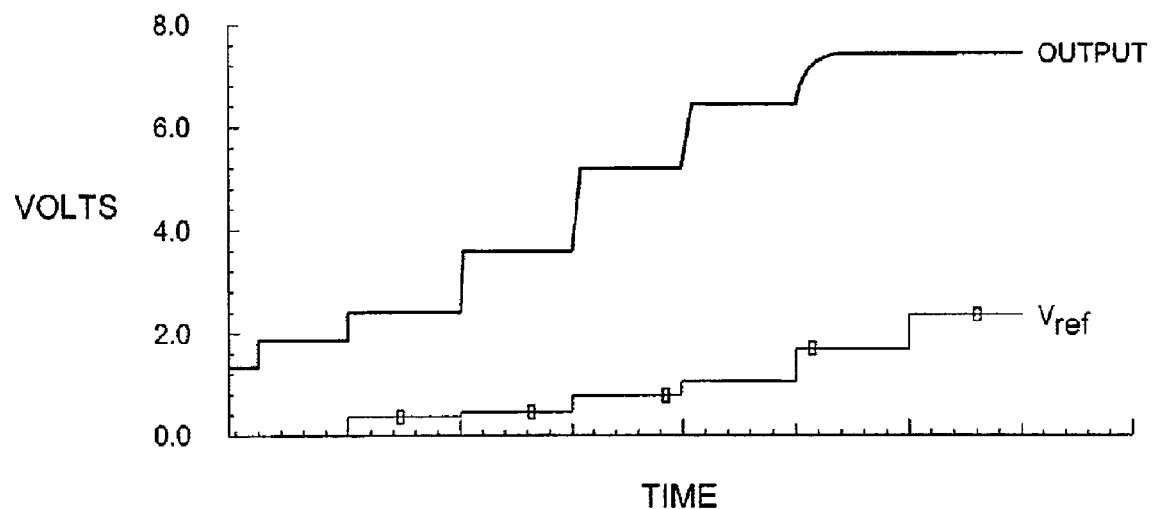
Fig._10
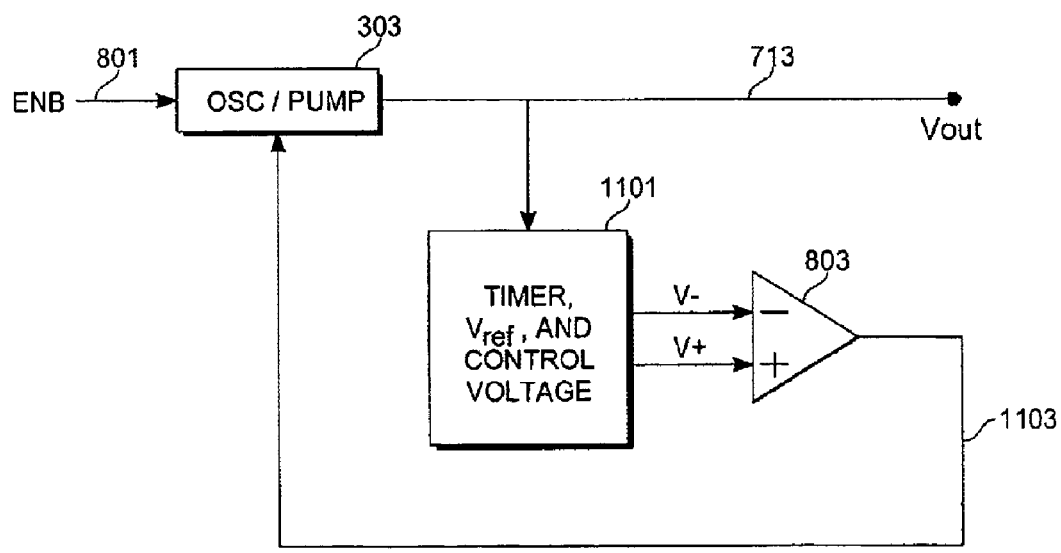
Fig._11

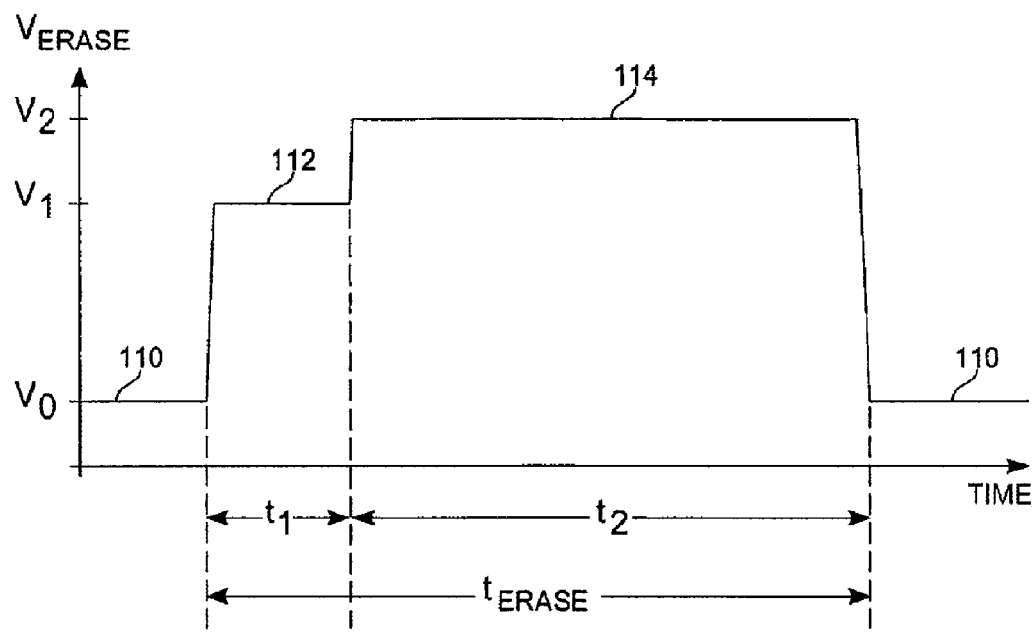
Fig._12A
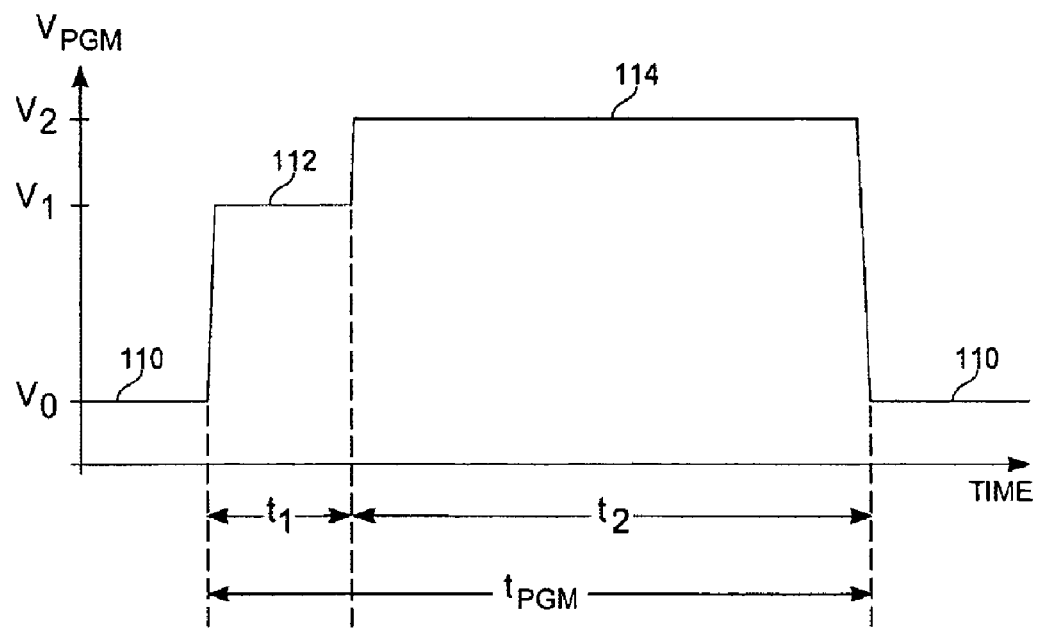
Fig._12B

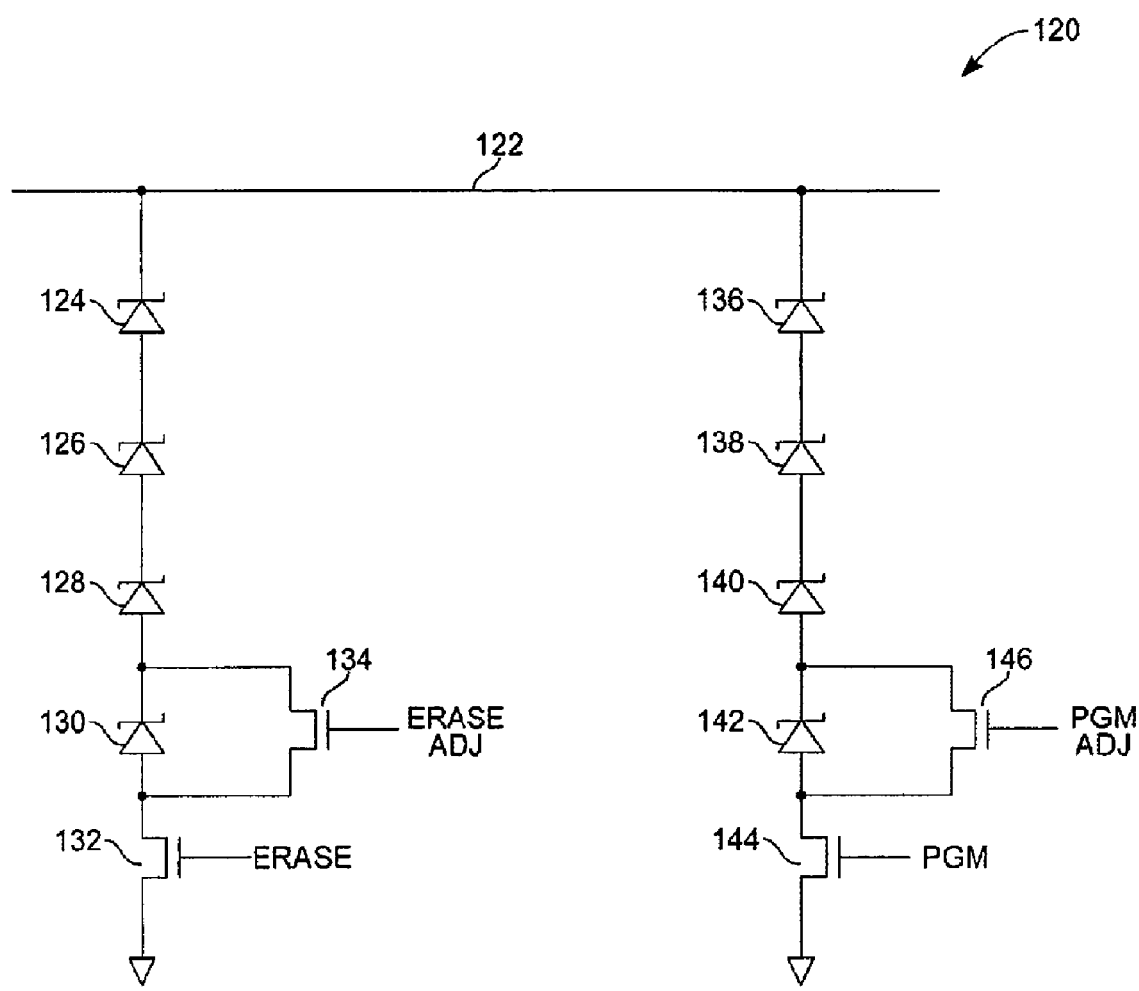
Fig._13

CIRCUIT TO CONTROL VOLTAGE RAMP RATE

RELATED APPLICATIONS

This application is a Divisional of U.S. application Ser. No. 11/291,606, filed on Nov. 30, 2005, which is incorporated herein by reference in its entirety.

TECHNICAL FIELD

This invention relates generally to non-volatile memory, e.g., electrically erasable and programmable read only memory (EEPROM). This invention relates specifically to a circuit and method for programming nonvolatile memory cells to avoid gate oxide breakdown and enhance reliability.

BACKGROUND

Nonvolatile memory cells, in particular EEPROM memory devices, are programmed by biasing a memory transistor within a memory cell to predetermined values. A memory transistor is programmed to one of two states by moving electrons into (or out of) a floating gate from a channel region, via a gate dielectric coupling the floating gate and the channel region; the gate dielectric typically being an oxide.

For example, NMOS memory transistors are erased when there is a negative charge (for example, −5 Volts with respect to common or ground) on the floating gate and in a written state when there is a positive charge on the floating gate (for example, +5 Volts with respect to common or ground). In such a device, to obtain a logical "1" value (erased state), electrons must tunnel into the floating gate which increases a threshold voltage of the floating gate transistor. To obtain a logical "0" value (written state) for the same device, electrons must tunnel from the floating gate which decreases the threshold voltage of the floating gate transistor.

A desired charge level is programmed by applying an appropriate combination of voltage pulses to the source, drain, and control gate of a memory transistor, for a designated period of time, in order to move electrons to or from the floating gate. Electrons tunnel into and are trapped in the memory cell's floating gate region or electrons are removed from the memory cell's floating gate region and the memory cell threshold voltage is modified. A mechanism referred to as Fowler-Nordheim tunneling can be used for both erase and program operations, whereby a desired charge level is established in the floating gate of the memory transistor. This mechanism is very slow (in the millisecond range) and requires a high-voltage source that is typically generated by high-voltage circuits (e.g., charge pumps) within the EEPROM memory device.

Referring to FIG. 1, a prior art, NMOS floating gate memory transistor (memory transistor) 10, is comprised of a control gate terminal 11, a floating gate 12, a drain terminal 13, and a source terminal 14. The memory transistor 10 is erased to a logic value "1" by applying a high voltage (12-15 Volts) to the gate terminal 11 of the memory transistor 10 and applying a low voltage (for example, ground) to the source terminal 14. Writing a logic value "0" to the memory transistor 10 can be achieved in two steps. First, the memory transistor 10 is erased or set to a logic value "1," as described above. Then, a high voltage is applied to the drain terminal 13 of the memory transistor 10 and a low voltage is applied to the control gate terminal 11, while the source terminal 14 is left floating. For certain embodiments in this application, a program operation will be treated as a single step, namely the second step of the previous sentence which is the inverse of the erase operation.

It is desirable to apply programming pulses that quickly program a memory cell or the memory transistor 10. However, applying a pulse with a voltage that is too high may over-program the memory transistor 10 or damage the gate oxide (not shown) isolating the floating gate 12 from a channel region (not shown) and destroy the memory transistor 10.

Generally, it is desirable to apply a high voltage pulse to the memory transistor 10 during a write operation. A high voltage, such as 15 Volts, quickly transfers electrons from the floating gate 12 and decreases the programming time for a memory cell with which the memory transistor 10 is associated. The stored charge on the floating gate 12 in combination with the applied voltage to the drain terminal 13 may cause the gate oxide to break down.

When the voltage between the drain terminal 13 and the floating gate 12 exceeds a breakdown limit, the gate oxide breaks down and the floating gate memory transistor 10 fails. A typical breakdown voltage may be 15 Volts to 20 Volts. However, as integrated circuit geometries shrink in size and gate oxide thicknesses decrease, the breakdown voltage for an individual device may decrease.

In one convention, when the memory transistor 10 is erased, a negative charge is stored on the floating gate 12. The charge stored on the floating gate 12 may be approximately −5 Volts. When a positive voltage pulse of, for example, +15 Volts is applied to the drain terminal 13 during a write operation, the voltage between the drain terminal 13 and the floating gate 12 is approximately 20 Volts, which may cause the gate oxide to break down.

Referring to FIGS. 2A-C, a 15 Volt pulse having a fast rising edge is applied to the drain terminal 13 of the memory transistor 10 of FIG. 1 ($V_{DRAIN}$, FIG. 2A). The floating gate 12 is charged to −5 volts ($V_{FG}$, FIG. 2B). A drain to floating gate differential voltage ($V_{DRAIN}-V_{FG}$, FIG. 2C) may exceed (e.g., as indicated by a shaded area of FIG. 2C) the breakdown voltage for the gate oxide, damaging the gate oxide and causing the memory transistor 10 to fail.

U.S. Pat. No. 6,392,931 to Pasotti et al. entitled "Method for High Precision Programming Nonvolatile Memory Cells, With Optimized Programming Speed" discloses applying a succession of voltage pulses to the control gate terminal of a selected memory cell necessary for reaching a final erase voltage value but does not address the problem of protecting the memory cell from breakdown.

U.S. Pat. No. 5,754,470 to Engh et al. entitled "Apparatus for Programming a Voltage Within a Storage Element" discloses a track and hold circuit and an integrator that determines a target voltage to be applied to a storage element. The apparatus includes a voltage ramp circuit and simultaneously reading the storage element to determine whether the storage element matches a target voltage. However, Engh only describes iteratively or repeatedly providing a plurality of write pulses and using a voltage ramp to increase the peak voltage of each successive pulse to avoid over-programming the storage cell.

It is desirable to have a stepped voltage to rapidly charge a floating gate while maintaining the charging voltage at a level that is less than a breakdown voltage for the gate oxide.

BRIEF DESCRIPTION OF THE DRAWINGS

FIGS. 2A-2C are memory transistor voltage waveforms associated with prior art program pulses.

FIG. 3 is a block diagram of an exemplary voltage ramp rate control circuit.

FIGS. 4A-4C are memory transistor voltage waveforms associated with the exemplary voltage ramp rate control circuit of FIG. 3.

FIG. 5 is a specific exemplary embodiment of a clamp circuit used in FIG. 3.

FIG. 6A is a control circuit waveform for an exemplary diode ladder clamp circuit of FIG. 5.

FIG. 6B is an output voltage waveform of the exemplary voltage ramp rate control circuits of FIG. 3 and FIGS. 7A-8B.

FIG. 10 depicts an exemplary reference voltage ($V_{ref}$) and programming voltage (output) of the circuit of FIG. 9.

FIG. 11 is an alternate exemplary embodiment of the voltage ramp rate control circuit of the present invention.

FIGS. 12A, 12B, and 12C are voltage versus time plots for erasing and programming non-volatile memory cells in accordance with the present invention.

FIG. 13 is an alternate embodiment of the ladder shown in FIG. 8B.

SUMMARY

Figure 1:
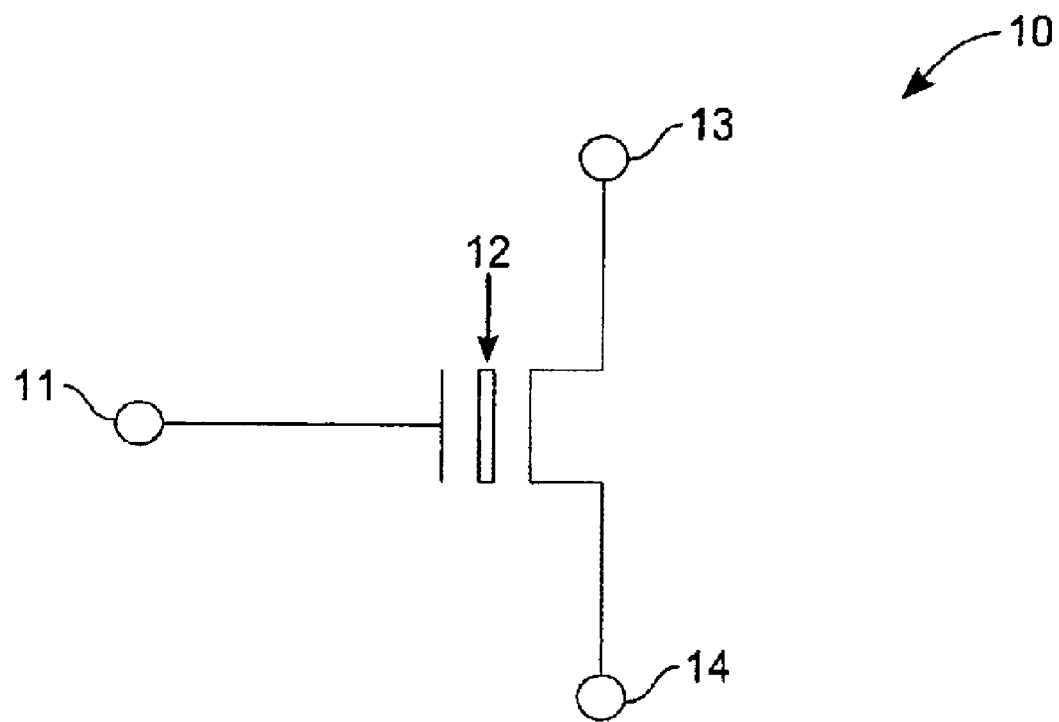
FIG. 1 is a diagram of a prior art EEPROM transistor.

The present invention is a method and apparatus to apply a stepped program voltage to a floating gate transistor, thus metering charge carriers, electrons or holes, onto the floating gate and controlling an overall voltage across a thin gate or tunnel oxide of the floating gate transistor to prevent a breakdown of the gate oxide. To meter charge onto the floating gate, the applied voltage must be high enough for tunneling or charge transfer to occur but not so high as to cause thin oxide breakdown. The apparatus, in one exemplary embodiment, is incorporated into a memory device and includes a high-voltage circuit to generate a program voltage for a memory transistor, a regulator circuit to regulate the high-voltage circuit via a feedback loop, and a timing circuit which controls a reference ladder. The reference ladder is coupled to the regulator circuit which provides, for example, a stepped program voltage to the memory cell. A maximum amplitude of the program voltage is chosen so as not to exceed a breakdown voltage of the gate oxide of the floating gate transistor during programming of the memory transistor.

In one method embodiment for applying an erase or program voltage to a non-volatile memory cell, a first charge transfer potential is applied to the floating gate of a memory cell and maintained by clamping for a first amount of time while some charge transfer occurs, then a second charge transfer potential is applied, higher than the first potential, and maintained by clamping for a second amount of time for further charge transfer. The process may be repeated but the charge transfer potential is kept below the tunnel oxide breakdown potential.

In a typical embodiment of the present invention, the total charge transfer time is $t_{erase}$ for an erase operation. A program operation has an analogous charge transfer time, $t_{pgm}$. The time $t_1$ during which a first potential $V_1$ above a starting zero order potential, $V_o$, is maintained is shorter than the time $t_2$ during which a second potential $V_2$ is maintained, where $V_2$ is greater than $V_1$, and may be on the order of about 8-10% of the total charge transfer time. If, for example, the total charge transfer time $t_{erase}$ is 1 msec, the time period $t_1$ may be about 100 µsec. In such an embodiment, the voltages $V_0$, $V_1$, and $V_2$ will, of course, depend on the particular geometry, process, type of charge carrier and minimum feature size of a technology for fabricating a particular non-volatile memory cell, but typical values might be $V_0=V_{DD}$, $V_1$=about 10V to about 13V, $V_2$=about 15V to about 16V, all below the threshold where oxide damage occurs, say 20V, but $V_1$ should be above the voltage where charge transfer occurs. Voltage could be positive or negative, depending on the charge carrier.

The method of the present invention, in an exemplary embodiment, includes generating and applying voltage across the floating gate of a memory transistor while regulating the voltage in a stepped fashion for durations sufficient to quickly and accurately transfer charge to the floating gate of the memory cell, while at the same time, maintaining the voltage to be below a breakdown voltage for the gate oxide of the memory transistor.

The method of the present invention can be implemented, in one embodiment, by employing clamp circuits controlled by fuse circuits. By programming different ones of the fuses, a high voltage charge pump output can be clamped at different high voltage stepping levels. The high-voltage stepping levels can be optimized by trying different fuse settings and checking the data retention results. The stepping levels can be selected at wafer sort.

DETAILED DESCRIPTION

Referring to FIG. 3, in a specific exemplary embodiment, an enable (ENB) signal applied to an enable line 301 activates an oscillator and high-voltage charge pump circuit 303 and also activates a timer circuit 305. The oscillator and high-voltage charge pump circuit 303 provides an output voltage that is higher than its supply voltage. The timer circuit 305 controls a clamp circuit 307 which controls a program voltage on output line 309.

In this embodiment, the oscillator and high-voltage charge pump circuit 303 comprises a Dickson charge pump circuit further comprising multiple diodes and capacitors. Dickson charge pumps are well known in the art. However, one skilled in the art would recognize that many alternative circuits are available to generate an output voltage greater than a circuit supply voltage, that a separate oscillator may be used to provide an input to a charge pump, and that the high voltage may even be provided from a separate circuit.

The timer circuit 305 may, for example, generate an analog or digitally controlled step voltage that is used as a reference control voltage to drive or regulate the clamp circuit 307 or in an alternate exemplary embodiment, a regulator or control circuit. The clamp circuit 307 clamps a program voltage on the output line 309 which rises with the oscillator and high-voltage charge pump circuit 303 output voltage until it reaches a first clamp at, for example, 10 Volts. The clamp circuit 307 subsequently clamps the output voltage at increasing levels in one or more timed steps to reach a maximum program voltage of, for example, 15 volts.

With reference to the example of FIGS. 4A-4C, a waveform depicting a stepped program or erase voltage output ($V_{Drain}$, FIG. 4A) of the voltage ramp rate control circuit of FIG. 3 is applied to a drain of a memory transistor. The stepped program or erase voltage has a fast rising edge which quickly rises to approximately 10 Volts. The memory transistor floating gate voltage ($V_{FG}$, FIG. 4B) is initially at −5 Volts.

As charge carriers stored in the floating gate tunnel through the gate oxide to a channel region, the voltage between the drain and the floating gate ($V_{DRAIN} - V_{FG}$, FIG. 4C) decreases. The stepped program or erase voltage is increased to predetermined levels in order to transfer charge to or from the floating gate in an efficient and fast manner. Controlling a program or erase voltage by this method avoids a breakdown of the floating gate oxide and, incidentally, may also provide a faster overall programming process by maintaining a controlled duration differential voltage across the floating gate, which directly affects a tunneling rate, without exceeding the breakdown voltage for the gate oxide. In specific alternate embodiments, a program or erase voltage with a uniformly rising edge may be used, or a program or erase voltage with multiple ramp rates may also be employed to program or erase the transistor.

Referring to FIG. 5, a specific exemplary embodiment of the clamp circuit 307 of FIG. 3 comprises a diode chain clamp circuit 511 including at least one pass transistor to control the voltage level on the output line 309. An unloaded oscillator and high-voltage charge pump circuit 303 may, for example, provide an output voltage of 15 Volts or higher. In this exemplary embodiment, the timer circuit 305 of FIG. 3 provides an output coupled to a first pass transistor (T1) 513, a second pass transistor (T2) 515, and a third pass transistor (T3) 517. For illustrative purposes, the voltage drop across each diode in the diode chain clamp circuit 511 is assumed to be 1 Volt.

Referring to FIGS. 6A and 6B, when T1 513 is activated by the timer circuit 305 of FIG. 3 at a first time 601, a voltage on the output line 309 will be clamped at 5 Volts. At a second time 603, T1 513 is deactivated and T2 515 is activated; the voltage on the output line 309 will be clamped at 8 Volts. At a third time 605, T2 515 is deactivated and T3 517 is activated, setting the voltage level on the output line 309 to 10 Volts. At a fourth time 607, T3 517 is deactivated and the maximum voltage (15 Volts) of the oscillator and high-voltage charge pump circuit 303 is present on the output line 309. The type, configuration, and number of diodes used may be selected to provide particular desired voltage steps, and the arrangement of pass transistors may be selected to correspond with desired voltage steps to control the program voltage present on the output line 309.

Figure 7A:
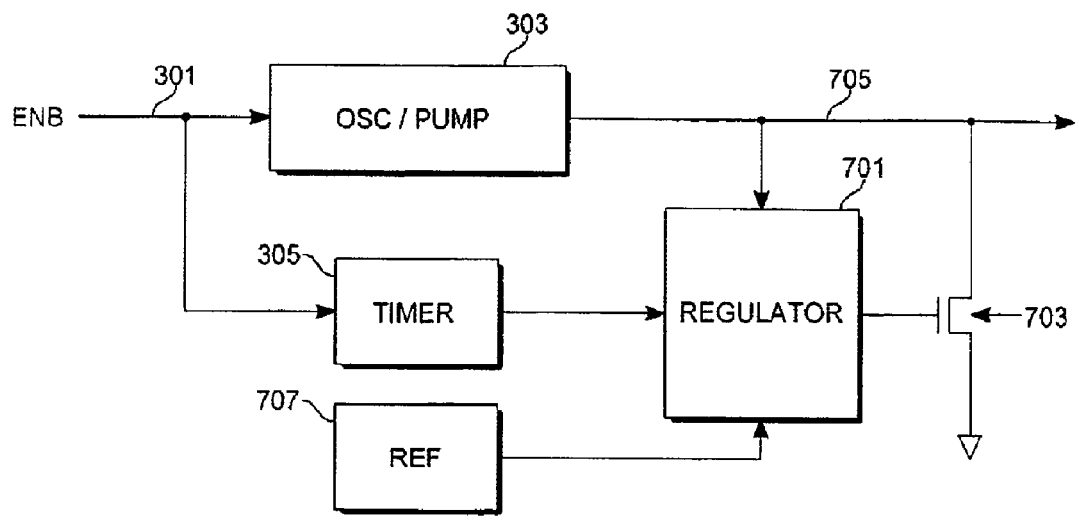
FIGS. 7A and 7B are block diagrams of alternate exemplary embodiments of the voltage ramp rate control circuit of the present invention.

Referring to FIG. 7A, in an alternate exemplary embodiment, an ENB signal on the enable line 301 activates the oscillator and high-voltage charge pump circuit 303 and also activates the timer circuit 305. The timer circuit 305 controls a shunt regulator circuit 701 that senses an output voltage from the oscillator and high-voltage charge pump circuit 303. In a specific exemplary embodiment, the shunt regulator circuit 701 controls a transistor device 703 which develops a stepped program voltage on a shunt regulated output line 705. A reference circuit 707 provides either a fixed or variable voltage reference for the shunt regulator circuit 701.

Figure 7B:
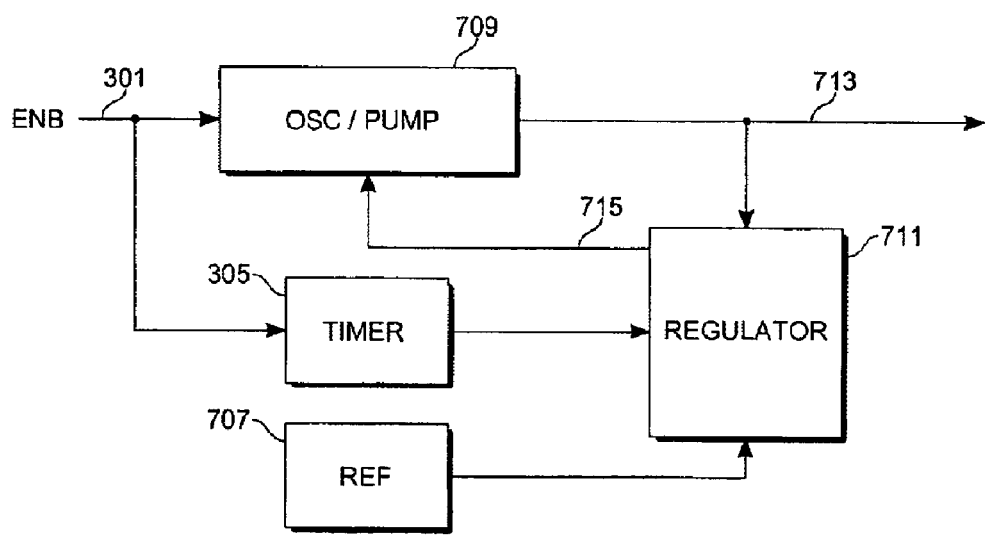

Referring to FIG. 7B, in another exemplary embodiment, an ENB signal on the enable line 301 activates a regulated oscillator and high-voltage charge pump circuit 709 and also activates the timer circuit 305. The timer circuit 305 controls a high-voltage charge pump regulator circuit 711 that senses or measures an output voltage from the regulated high-voltage charge pump circuit 709 and controls a stepped program voltage on a regulated high-voltage circuit output line 713 by means of a control signal conducted via a feedback line 715. A voltage reference 707 provides either a fixed or variable voltage reference for the high-voltage charge pump regulator circuit 711.

In a specific exemplary embodiment, if a voltage level output on the regulated high-voltage circuit output line 713 is too high, the regulated oscillator and high-voltage charge pump circuit 709 is deactivated by the high-voltage charge pump regulator circuit 711 via a control signal asserted on the feedback line 715. If the voltage level output on the regulated high-voltage circuit output line 713 is too low, the regulated high-voltage charge pump circuit 709 is activated by the high-voltage charge pump regulator circuit 711 via a control signal asserted on the feedback line 715.

Figure 8A:
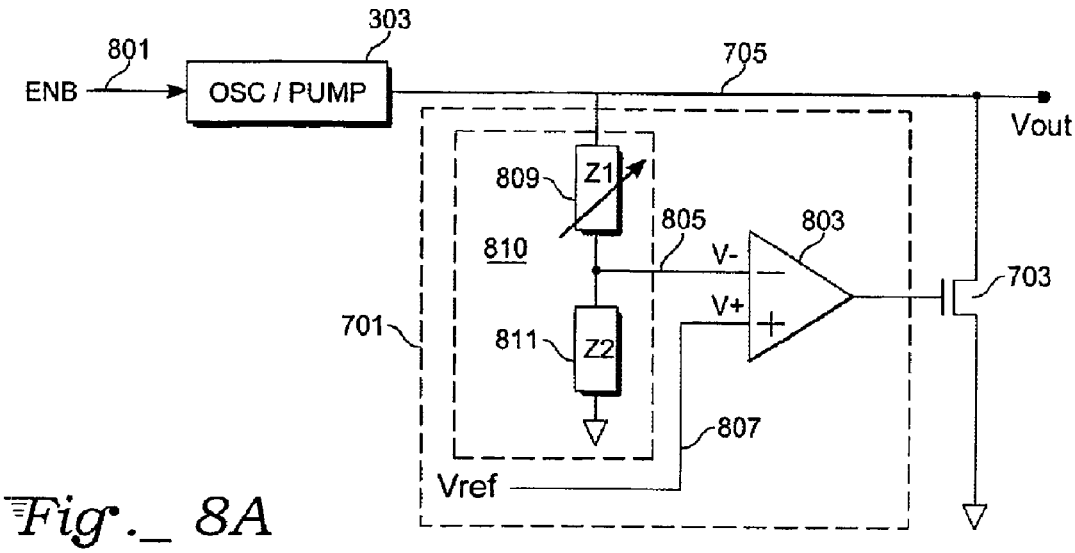
FIG. 8A is an alternate embodiment of the voltage ramp rate control circuit diagrams of the present invention.

Referring to FIG. 8A, a specific exemplary embodiment of the present invention includes the oscillator and high-voltage charge pump enable line 801, an oscillator and high-voltage charge pump circuit 303, and a specific exemplary embodiment of the shunt regulator circuit 701. The shunt regulator circuit 701 output is coupled to a gate terminal (or base terminal) of the transistor device 703. The transistor device 703 is also coupled to ground and the shunt regulated output line 705. A voltage divider 810 is used to provide a variable voltage to a differential amplifier 803 via a first input line 805. A second input line 807 couples the differential amplifier 803 to a constant voltage reference source ($V_{ref}$). The first input line 805 couples the shunt regulator circuit 701 to a variable impedance device 809 and a fixed impedance device 811. The variable impedance device 809 is controlled by, for example, a timer circuit (not shown). The variable impedance device 809 is further coupled to the shunt regulated output line 705 of the oscillator and high-voltage charge pump circuit 303. The fixed impedance device 811 is also coupled to a fixed or constant voltage source, for example, ground. The characterization of the control amplifier may be described by the equation $$Vout = Vref * (Z1 + Z2) / Z2$$

Figure 8B:
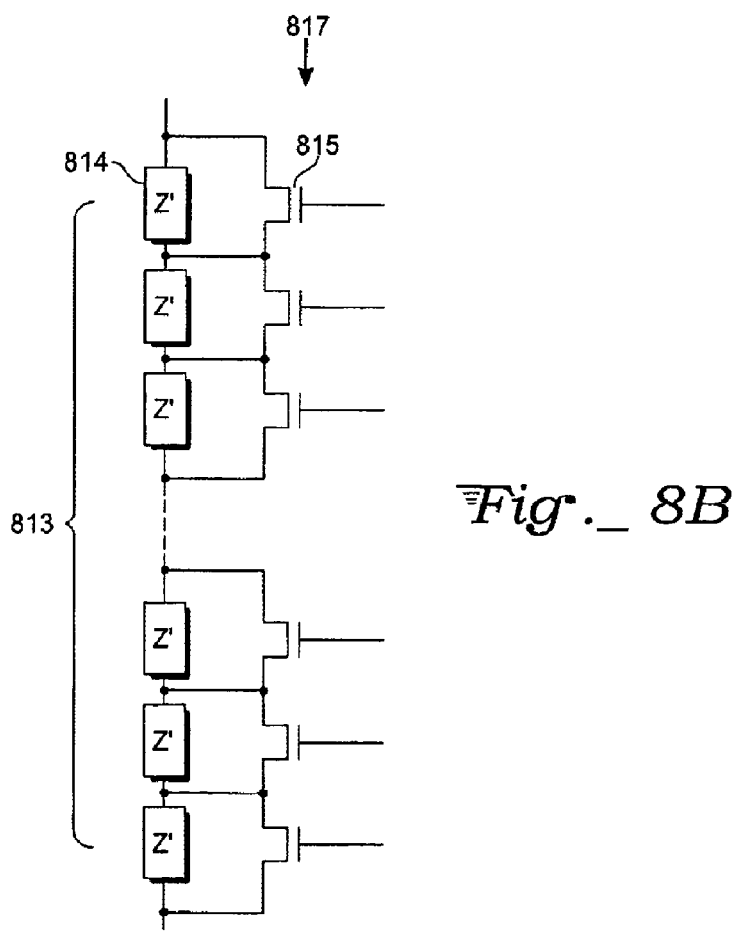
FIG. 8B is an exemplary embodiment of a resistance ladder used to provide variable resistance for the regulator circuit of FIG. 8A.

Referring to FIG. 8B, a specific embodiment of the variable impedance device 809 includes an impedance ladder 813 comprising a plurality of impedance devices and at least one impedance ladder select device 815. A select impedance device 814 in the impedance ladder 813 may have a value equal to the other impedance devices, or a value that is different in comparison to the other impedance devices. Each impedance device 814 may also be programmed or trimmed.

This specific embodiment includes a plurality of transistors 817 as the impedance ladder select devices 815. A gate terminal of each transistor in the plurality of transistors 817 is coupled to a timer or timing circuit (not shown) which selectively bypasses one or more transistors to vary an overall impedance of the impedance ladder 813. The timer or timing circuit may provide control waveforms similar to the waveforms illustrated in FIG. 6A, and an output of the circuit may be similar to the voltage waveform illustrated in FIG. 6B.

Figure 9:
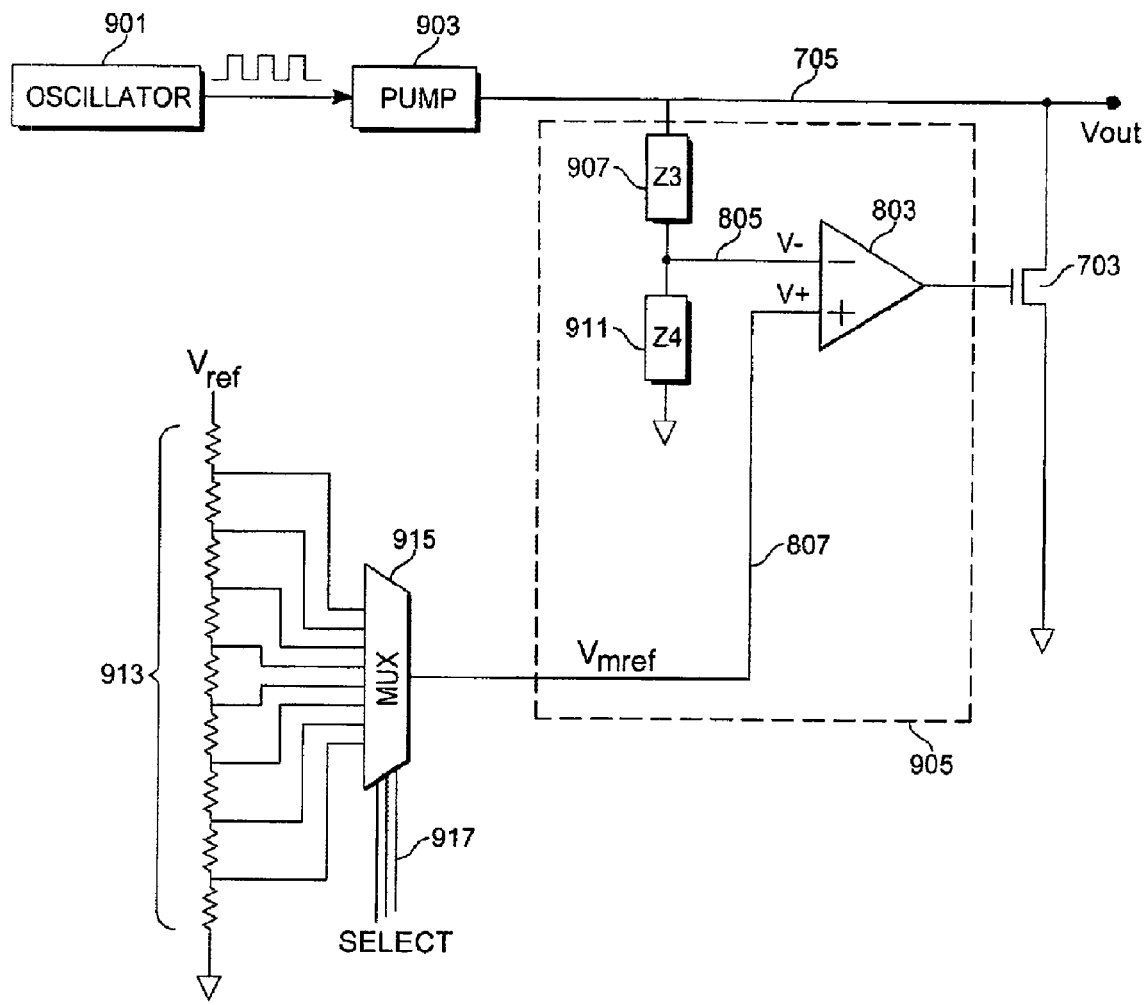
FIG. 9 is an alternate exemplary embodiment of the voltage ramp rate control circuit of the present invention.

Referring to FIG. 9, in another exemplary embodiment, an oscillator 901 is coupled to and provides a current source for a charge pump 903. A selectable reference voltage regulator 905 is provided to control the transistor device 703 which regulates a voltage on shunt regulated output line 705. Impedance elements 907 (Z3), 911 (Z4) are fixed and provide a voltage level proportional to the voltage present on the shunt regulated output line 705 to the first input line 805 of the differential amplifier 803. In a specific exemplary embodiment, a resistance ladder 913 with a plurality of taps is coupled to a multiplexer 915 which provides a selectable reference voltage ($V_{mref}$) to the second input line 807 of the differential amplifier 803. The multiplexer 915 output is controlled by a timing circuit (not shown). In an alternate embodiment, a timing circuit may provide a stepped reference voltage to the second input line 807. The differential amplifier 803 output is coupled to a gate terminal (or base terminal) of the transistor device 703. The voltage output on the shunt regulated output line 705 of the circuit may be similar to the voltage waveform illustrated in FIG. 6B.

Referring to FIG. 10, a variety of voltage steps define exemplary waveforms for a reference voltage and an output voltage for the voltage ramp rate control circuit of FIG. 9. A time or width and a voltage level of each step may be controlled. For example, the voltage steps may range in time from several microseconds to several hundred microseconds. Also, a voltage step may be controlled to provide up to a peak output of a high voltage source or a small percentage of a peak output voltage.

In a specific exemplary stepped program voltage, a voltage may rise to a maximum program voltage and have distinct voltage steps in a range of 25 microseconds to 200 microseconds for each step. For example, there may be a total of three to eight steps between 0 Volts and the peak voltage, and a total rise time may be from 100 microseconds to 300 microseconds. In addition to the waveform of FIG. 10, a variety of alternate waveforms may be provided to the operational amplifier 803 (FIG. 8A). For example, the voltage steps may also be controlled to step up, step down, and then step up again. The stepped program voltage rise time may be controlled for an exemplary pulse having a total duration of 1 millisecond to 5 milliseconds. A profile of a programming voltage may be defined during a memory device testing procedure to match the floating gate oxide characteristics of each memory device.

Referring to FIG. 11, another exemplary embodiment includes the oscillator and high-voltage charge pump enable line 801, the oscillator and high-voltage charge pump circuit 303, a timing and control circuit 1101, the differential amplifier 803, an oscillator and high-voltage charge pump control line 1103, and the regulated output line 713. In this embodiment, a feedback signal is transmitted to the oscillator and high-voltage charge pump circuit 303 via oscillator and high-voltage charge pump control line 1103. Controlling the oscillator and high-voltage charge pump circuit 801 with a feedback signal eliminates the need for the transistor device 703 of previous embodiments. The ENB signal on oscillator and high-voltage charge pump enable line 801 starts or activates the oscillator and high-voltage charge pump circuit 303. The timing and control circuit 1101 provides a reference voltage and a variable voltage to the inputs of the differential amplifier 803. The oscillator and high-voltage charge pump control line 1103 is coupled to the oscillator and high-voltage charge pump circuit 303 to control an output voltage on the regulated output line 713. An output of the differential amplifier 803 may be used, for example, to control oscillator frequency, voltage amplitude, or to activate either an oscillator or a high-voltage pump circuit of the oscillator and high-voltage charge pump circuit 303. Since a variable voltage having a controlled rising edge is provided to the differential amplifier 803, the voltage output on the regulated output line 713 may be similar to the voltage waveform illustrated in FIG. 6B.

In one particular embodiment of the invention illustrated in FIG. 12A, a graph of voltage vs. time for the output of a high-voltage charge pump used for supplying an erase potential to a selected non-volatile memory cell shows the application of an erase potential according to one aspect of the present invention. When the high voltage charge pump output is ramped up, it will be clamped at a certain stepping level for a certain period of time before going to the full high level. In this embodiment, erasing will place charge carriers on the floating gate and programming will remove charge carriers.

As shown in FIG. 12A, the potential $V_0$ at reference numeral 110 is set to a zero-order level that is insufficient to cause charge transfer, such as Fowler-Nordheim tunneling or hot carrier injection to take place. The erase potential is raised to a first erase potential $V_1$, shown at reference numeral 112, that is sufficient to initiate the charge transfer mechanism that places charge carriers, say electrons, onto the floating gate associated with the memory cell to be erased. This starts to shift the threshold of the memory cell transistor to a more positive voltage.

The potential $V_1$ is maintained for a selected time period $t_1$, after which the erase potential is raised to a second potential $V_2$, shown at reference numeral 114, for a selected time period $t_2$. During the time period $t_1$, electrons are placed onto the floating gate at a relatively slow rate according to the magnitude of the applied potential. The present invention allows some erasing to occur at the lower potential $V_1$ for a certain period of time to add some negative charge to the floating gate before the high voltage reaches its maximum. The potential $V_1$ is selected to be at the level where tunneling or hot electron injection starts to occur but the electric field is not high enough to damage the oxide. This reduces the maximum field across the thin oxide, which reduces the amount of stress to which the oxide isolating the floating gate is subjected. Since the stress is the cause of the damage, the present invention reduces the likelihood of stress-induced oxide damage.

In a typical embodiment of the present invention, the total erase time is $t_{erase}$. The time $t_1$ during which the potential $V_1$ is maintained is shorter than the time $t_2$ during which the potential $V_2$ is maintained and may be on the order of about 8-10% of the total erase time. If, for example, the total erase time $t_{erase}$ is 1 msec, the time period $t_1$ may be about 100 µsec. In such an embodiment, the voltages $V_0$, $V_1$, and $V_2$ will, of course, depend on the particular geometry, process, and minimum feature size of a technology for fabricating a particular non-volatile memory cell, but typical values might be $V_0=V_{DD}$, $V_1$=about 10V to about 13V, $V_2$=about 15V to about 16V.

While the particular embodiment of the present invention disclosed with reference to FIG. 12A employs a single intermediate erase voltage level $V_1$ to which the charge pump voltage is set prior to applying the full erase voltage $V_2$, persons of ordinary skill in the art will appreciate that one or more additional increasing erase voltage steps could be employed in the method according to the present invention.

The principles of the present invention are applicable as well to the non-volatile memory programming process, during which charge carriers, say electrons, are removed from the floating gates of memory cells. This aspect of the present invention is illustrated with reference to FIG. 12B. Persons of ordinary skill in the art will observe that the polarity of the program and erase potentials illustrated in FIGS. 12A and 12B will necessarily be opposite to one another and thus that the Y axis values shown in FIGS. 12A and 12B are absolute values of these potentials.

In one particular embodiment of the invention illustrated in FIG. 12B, a graph of voltage vs. time for the output of a high-voltage charge pump used for supplying a programming potential to a selected non-volatile memory cell shows the application of a programming potential according to one aspect of the present invention. When the chip ramps up the high voltage charge pump output, it will be clamped at a certain stepping level for a certain period of time before going to the full high voltage programming level. As shown in FIG. 12B, the potential $V_0$ is set to a level that is insufficient to cause electrons to be removed from the floating gate via charge transfer mechanisms such as Fowler-Nordheim tunneling or hot carrier injection. The programming potential is raised to a first programming potential $V_1$, that is sufficient to initiate the charge transfer mechanism that removes electrons from the floating gate associated with the memory cell to be programmed.

In FIG. 12B, a graph of voltage vs. time for the output of a high-voltage charge pump used for supplying a programming potential to a selected non-volatile memory cell shows the application of a programming potential according to one aspect of the present invention. The high voltage charge pump output is clamped at a certain step for a certain period of time before going to the full high voltage programming level. As shown in FIG. 12B, the potential 110, $V_0$, is a level that is insufficient to cause charge carriers to be removed from the floating gate via charge transfer mechanisms such as Fowler-Nordheim tunneling or hot carrier injection. The programming potential is raised to a first programming potential 112, $V_1$, for a preset time, $t_1$, that is sufficient to initiate the charge transfer mechanism that removes electrons from the floating gate associated with the memory cell to be programmed.

The potential $V_1$, shown at reference numeral 112, maintained for a selected time period $t_1$ after which the programming potential is raised to a second potential $V_2$, shown at reference numeral 114, for a selected time period $t_2$. During the time period $t_1$, charge carriers are removed from the floating gate at a relatively slow rate according to the magnitude of the applied potential. The present invention allows some programming to occur at the lower potential $V_1$ for a certain period of time to place some positive charge on the floating gate before the high voltage reaches its maximum. The potential $V_1$ is selected to be at the level where tunneling or hot electron injection starts to occur but the electric field is not high enough to damage the oxide. As with the erase potentials described with reference to FIG. 12A, this reduces the maximum field across the thin oxide, which reduces the amount of stress to which the oxide isolating the floating gate is subjected. Since the stress is the cause of the damage, the present invention reduces the likelihood of stress-induced oxide damage.

While the particular embodiment of the present invention disclosed with reference to FIG. 12B employs a single intermediate programming voltage level $V_1$ to which the charge pump voltage is set prior to applying the full programming voltage $V_2$, one or more additional increasing programming voltage steps could be employed in the method according to the present invention.

Figure 12C:
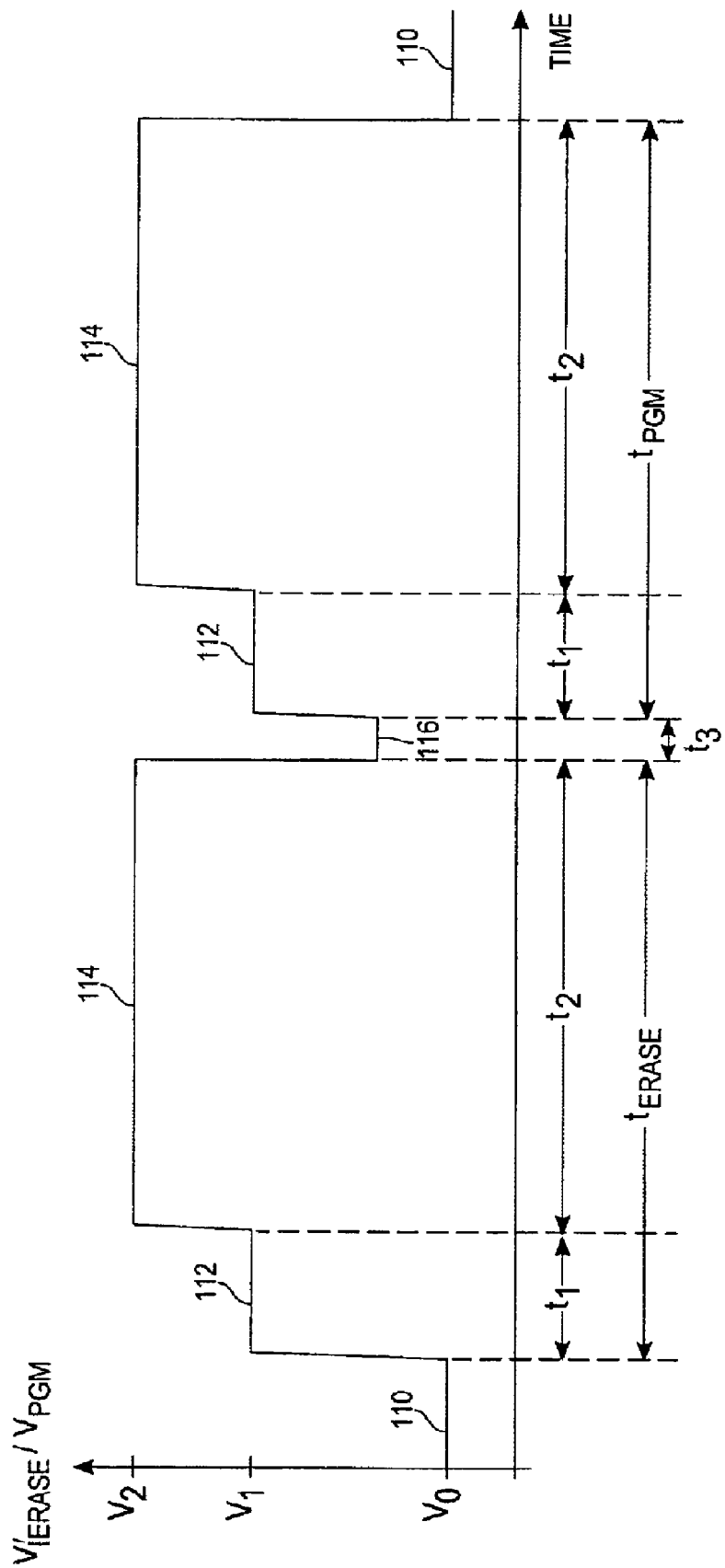

Referring now to FIG. 12C, a graph of voltage vs. time illustrates a sequence in which a selected memory cell is first erased and then programmed in accordance with the two step programming process previously described. The graph of FIG. 12C includes both the graphs of FIGS. 12A and 12B, and, in this respect, the erase and program processes illustrated in FIG. 12C are the same as the corresponding processes described with reference to FIGS. 12A and 12B using absolute values of voltage. The process of FIG. 12C includes an additional time period $t_3$, located between the erase time interval $t_{erase}$ and the programming time interval $t_{pgm}$. It is presently preferred that the voltage during the time period $t_3$ be set to an intermediate value, shown at reference numeral 116, between the value $V_0$ and the value $V_1$. This intermediate value is selected to be a voltage at which no appreciable charge transport occurs.

Setting the voltage to the intermediate value between the erasing and programming operations decreases the total time needed to perform both operations since the voltage does not have to rise and fall the additional amount to and from $V_0$. While the time saved in the programming of one cell is not, in itself, significant, the time saved over the erase and programming operations in many cells in a large array becomes significant.

The embodiment disclosed with reference to FIG. 12C employs a single step in both the erase and programming voltage sequences. The combined erase and programming operation could also employ multiple erase voltage and programming voltage steps.

Referring now to FIG. 13, showing a variant embodiment, an exemplary clamping circuit 120 is shown to include zener diodes 124, 126, 128, and 130 connected in series between charge pump output line 122 and ground. A first n-channel MOS transistor 132 selectively couples the anode of zener diode 130 to ground when an ERASE signal is applied to its gate, acting like a fuse. A second n-channel MOS transistor 134 selectively shorts zener diode 130 when an ERASE ADJ signal is applied to its gate where ERASE ADJ is shown on FIG. 13.

The erase-voltage clamp is enabled when first n-channel MOS transistor 132 is turned on when an ERASE signal is applied to its gate and clamps the charge pump output line to a voltage determined by the sum of the series zener breakdown voltages of zener diodes 124, 126, 128, and 130. Initially, the ERASE ADJ signal is asserted at the gate of second MOS transistor 134 and zener diode 130 is shorted. After the time period $t_1$ has passed, the ERASE ADJ signal is de-asserted at the gate of second MOS transistor 134 and zener diode 130 is no longer shorted and is thus placed in the circuit. This produces the voltage $V_2$. During time periods other than $t_{erase}$, $t_{pgm}$, and $t_3$, the charge pump is not enabled, and the charge pump output line is shorted to $V_{DD}$ through a device such as a pass gate. This assures that high voltages are not present on the charge pump output line during normal operation of the device.

A programming-voltage clamp includes zener diodes 136, 138, 140, and 142 connected in series between charge pump output line 122 and ground. A third n-channel MOS transistor 144 selectively couples the anode of zener diode 142 to ground when a PGM signal is applied to its gate. A fourth n-channel MOS transistor 146 selectively shorts zener diode 142 when a PGM ADJ signal is applied to its gate.

The programming-voltage clamp is enabled when third n-channel MOS transistor 144 is turned on when an PGM signal is applied to its gate and clamps the charge pump output line to a voltage determined by the sum of the series zener breakdown voltages of zener diodes 136, 138, 140, and 142. Initially, the PGM ADJ signal is asserted at the gate of fourth MOS transistor 146 and zener diode 42 is shorted. This produces an intermediate voltage $V_1$ that allows some charged particles to be removed from the floating gate. After the time period $t_1$ has passed, the PGM ADJ signal is de-asserted at the gate of fourth MOS transistor 146 and zener diode 142 is no longer shorted and is thus placed in the circuit. This produces the highest voltage below the damage threshold voltage for further charged particle transfer.

The programming and erasing time intervals can be controlled by a timer as is known in the art. The time period for the high voltage stepping level can be controlled by the same timer. For example, clamp the high voltage at the stepping level for the first ⅛ of the erasing time, and the first ⅛ of the programming time.

Presented in this description are exemplary circuits and methods for providing programming voltages to memory cells. Those of skill in the art will recognize that the invention can be practiced with modification and alteration within the spirit and scope of the appended claims and many other embodiments will be apparent to those of skill in the art upon reading and understanding this description. This description is thus to be regarded as illustrative rather than limiting. The scope of the invention should, therefore, be determined with reference to the appended claims, along with the full scope of equivalents to which said claims are entitled.

What is claimed is:

1. A voltage control circuit comprising:
a generation means for generating a voltage signal for application to a memory transistor;
a regulation means for regulating the generation means at a predetermined level in response to a control signal, wherein the regulation means comprises a feedback loop to the generation means; and
a control means for providing a predetermined control signal to the regulation means, the predetermined control signal configured to drive a corresponding rising edge from the voltage signal so as to maintain a voltage on the memory transistor that is less than a breakdown voltage of the memory transistor.

2. The control circuit of claim 1, wherein the generation means comprises:
an oscillator and a charge pump, the charge pump to provide a voltage greater than a circuit supply voltage.

3. The control circuit of claim 2, wherein the regulation means comprises:
a feedback loop to at least one of the oscillator or the charge pump.

4. The control circuit of claim 3, wherein the regulation means activates or deactivates at least one of the oscillator or the charge pump.

5. The control circuit of claim 1, wherein the regulation means is coupled to a transistor device, the transistor device to control the voltage signal generated by the generation means.

6. The control circuit of claim 1, wherein the control means drives a variable voltage reference signal to the regulator means.

7. The control circuit of claim 1, wherein the control means controls a variable impedance ladder that is coupled to the regulation means.

8. A voltage control circuit, comprising:
a voltage generating circuit to generate a voltage signal for application to a memory transistor;
a regulator circuit coupled to the voltage generating circuit, the regulator circuit to regulate the voltage generating circuit via a feedback loop to the voltage generating circuit; and
a controller to provide a predetermined control signal to a reference ladder, the reference ladder being coupled to the regulator circuit to maintain a variable voltage on the memory transistor, a maximum amplitude of the variable voltage being less than a breakdown voltage of the memory transistor.

9. The control circuit of claim 8, wherein the voltage generating circuit comprises:
an oscillator and a charge pump.

10. The control circuit of claim 9, wherein the regulator circuit is to activate or deactivate at least one of the oscillator or the charge pump.

11. The control circuit of claim 8, wherein the predetermined control signal is matched to a memory device during a test operation to avoid breakdown of the memory device.

12. The control circuit of claim 8, further comprising:
a charge pump.

13. The control circuit of claim 12, further comprising:
a switchable clamp circuit to be coupled to the charge pump.

14. The control circuit of claim 13, wherein the switchable clamp circuit comprises:
a series connected string of diodes.

15. The control circuit of claim 13, wherein the switchable clamp circuit comprises:
at least one switching transistor coupled to a diode coupled to the charge pump.

16. A method comprising:
generating a generated voltage to be applied to a memory transistor;
regulating the generated voltage at a predetermined voltage level in response to a control signal; and
generating the control signal to maintain the generated voltage at the memory transistor, the generated voltage being less than a breakdown voltage of the memory transistor, wherein regulating the generated voltage at a predetermined voltage level comprises providing a signal to activate or deactivate at least one of an oscillator or a charge pump.

17. The method of claim 16, further comprising:
controlling a variable voltage reference signal used to regulate the generated voltage at the predetermined voltage level.

18. The method of claim 16, further comprising:
controlling a variable impedance ladder to regulate the generated voltage at the predetermined voltage level.

* * * * *